United States Patent [19]

Amador et al.

[11] Patent Number: 5,201,453
[45] Date of Patent: Apr. 13, 1993

[54] LINEAR, DIRECT-DRIVE MICROELECTRONIC BONDING APPARATUS AND METHOD

[75] Inventors: Gonzalo Amador, Dallas; Rafael C. Alfaro, The Colony; Robert A. Davis, Irving, all of Tex.

[73] Assignee: Texas Instruments Incorporated, Dallas, Tex.

[21] Appl. No.: 767,731

[22] Filed: Sep. 30, 1991

[51] Int. Cl.$^5$ ............................................. B23K 1/06
[52] U.S. Cl. ..................................... 228/110; 228/1.1; 228/4.5; 228/179; 366/127
[58] Field of Search ................. 228/110, 179, 1.1, 4.5; 366/127, 120

[56] References Cited

U.S. PATENT DOCUMENTS

| | | | |
|---|---|---|---|
| 3,526,554 | 9/1970 | Obeda | 228/110 |
| 4,249,986 | 2/1981 | Obeda | 228/1.1 |
| 4,513,190 | 4/1985 | Ellett et al. | 228/1.1 |
| 4,854,494 | 8/1989 | von Raben | 228/110 |
| 4,893,742 | 1/1990 | Bullock | 228/110 |

OTHER PUBLICATIONS

Texas Instruments Process Automation Center Brochure for ABACUS IIISE Wire Bonder Copyright 1991.

*Primary Examiner*—Richard K. Seidel
*Assistant Examiner*—Jeffrey T. Knapp
*Attorney, Agent, or Firm*—W. James Brady, III; B. Peter Barndt; Richard L. Donaldson

[57] ABSTRACT

A linear, direct-drive microelectronic bonding apparatus (10) provides a bondhead mounting plate (20), a stationary magnetic circuit (21), a moving coil (22), a primary wire clamp housing (23), a transducer mount (24), and a high frequency ultrasonic transducer (25) (above 100 kHz), and a capillary (26). Bondhead assembly (16) is configured to present a collective axial wire path bore (27) along which wire (12) is fed to bond site (28) for forming microelectronic bond interconnections at bond site (28). In accordance with the invention, collective wire path bore (27) provides a protected method of feeding wire (12) to bonding site (28), while magnetic circuit (21) and moving coil (22) provide actuation in a substantially linear downward direction towards the bonding site. In contradistinction, prior art bonding strokes, rather than being substantially linear, are arc-like due to the capillary and transducer being perpendicular to one another. In the present invention, transducer (25) and capillary (26) are substantially axially aligned. The substantially vertical downward bonding stroke allows bondhead assembly (16) to be used for "deep access" packages and other hard-to-reach sizes, shapes and designs of packages. In addition, ultrasonic transducer (25) has a reduced mass in comparison to the prior art which, in conjunction with the high frequency ultrasonic energy provides a low amplitude oscillation weld with greater precision and positioning.

12 Claims, 2 Drawing Sheets

LINEAR, DIRECT-DRIVE MICROELECTRONIC BONDING APPARATUS AND METHOD

CROSS-REFERENCE TO RELATED APPLICATIONS

The following coassigned patent applications are hereby incorporated herein by reference: TI-14427, filing date Sep. 30, 1991; Ser. No. 07/767,741; TI-15067, filing date Sep. 30, 1991; Ser. No. 07/767,740; TI-14570, filing date Sep. 30, 1991: Ser. No. 07/768,501.

BACKGROUND OF THE INVENTION

1. Field of the Invention

This invention relates to integrated circuit interconnections and the method of forming them. More particularly, it relates to a bondhead assembly with a substantially linear stroke.

2. Description of the Prior Art

Conventional bonding apparatus for forming microelectronic interconnecting bonds, have utilized an arcing motion for many years. Conventional bondheads are typically moved by some kind of linkage such as the four-bar linkage of FIG. 1. The mechanical linkage attached to the conventional bondhead assembly results in a lack of precision in positioning the bondhead assembly as well as a lack of precision in the bonding stroke itself. The arcing motion also causes limited control of the bonding force. Additionally, since the capillary or other bonding tool is not approaching the bond site in a vertical orientation, there is a lack of physical optimization of the bonding parameters. In particular, the lack of perpendicularity between bonding tool and bonding site diminishes the transmission of ultrasonic energy.

One problem with conventional bonders is the lack of access to packages which are geometrically or physically difficult to reach (e.g. "deep access" packages). One example of such a package is a pin grid array (PGA) presenting multiple planes of access for bonding purposes or for access purposes, and thus portions of the bonding apparatus may be obstructed by the geometry of the package. In addition, certain packages may have different levels at which bonding must be performed, thus creating inherent precision problems with the above-discussed technology. That is to say, if the bondhead is aligned to be substantially perpendicular for bonding at one level (e.g. leadframe level) it will be skewed at another level (e.g. die level).

Another problem attendant with the conventional technology is that the wire being fed through the capillary has a hazardous route as it is fed into the bondhead assembly. In other words, any number of physical obstructions, operator accidents or inadvertent contact with equipment in the area can lead to nicks and/or bends in the wire. These kinds of unintentional impacts on the wire can often lead to undesirable, permanent deformation thereof.

What is needed is a bonding apparatus which provides flexible access (e.g. for deep access packages or multilevel packages) with the capability for more precision in positioning and the bonding stroke of the bondhead assembly. In addition, it would be highly desirable to have a bonding apparatus which better protected the bonding wire.

SUMMARY OF THE INVENTION

The problems outlined above are in large measure solved by the method and apparatus in accordance with the present invention. That is to say, the invention hereof provides apparatus in a bonding process with a substantially linear bonding stroke (in the z axis), therefore eliminating arcing. Thus with the substantially linear bonding stroke, greater access is provided to deep access packages and multilevel packages. Also a more flexible bonding process is achieved (i.e. applicable to a variety of packages). Additionally the invention provides a bondhead assembly with direct drive therein, thus eliminating linkage external to the assembly for purposes of the bond stroke. This aspect of the invention also greatly enhances the precision of the bonding stroke. In addition, the present invention provides structure for protecting the bonding wire within the bondhead assembly by providing an axial bond wire bore path therein, thus protecting the wire from the hazards referred to above.

In the preferred embodiments the direct drive mechanism incorporates a moving coil linear motor which provides great precision in the bonding stroke and control of the bonding parameters. In addition the preferred bonding apparatus utilizes high frequency ultrasonic (H.F. US) energy in a range above about 100 kHz. The shorter wavelength of H.F. US compared to, for example, about 60 kHz allows the H.F. ultrasonic transducer to have a reduced length and mass compared to the prior art. This is possible due to the lower amplitude oscillation associated with the H.F. US. The reduced mass ultrasonic transducer thus provides greater precision and more control in the bond stroke.

DETAILED DESCRIPTION OF THE PREFERRED EMBODIMENT

Figure 1:
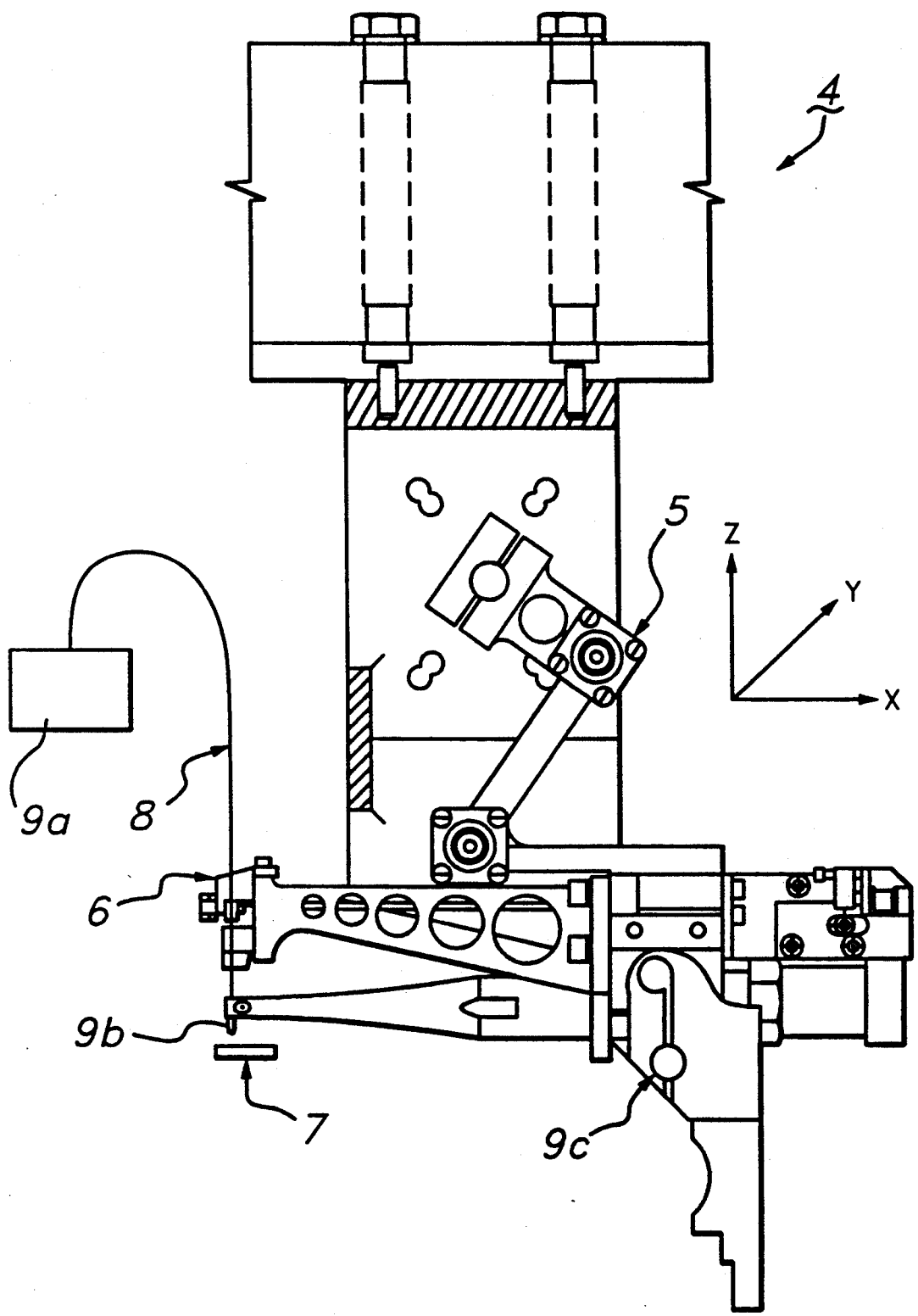
FIG. 1 is a schematic depiction of a four-bar linkage used with bondhead assemblies used in the prior art.

Referring now to the drawing in general and FIG. 1 in particular, a prior art bonding apparatus 4 incorporating a four-bar linkage 5 is shown. A bondhead 6 is poised over IC 7 for a bonding stroke to make a ball bond or a stitch bond. The bonding stroke of bondhead 6 utilizes an arcing movement designed to produce translation in the Z direction. Wire 8 is fed from a feeder 9a into a bonding tool 9b (e.g. a capillary) and thermosonically bonded on IC 7. The arcing movement mentioned results from rotation about axis 9c. Note the positive X, Y, and Z axes shown in FIG. 1 for spatial orientation.

Figure 2:
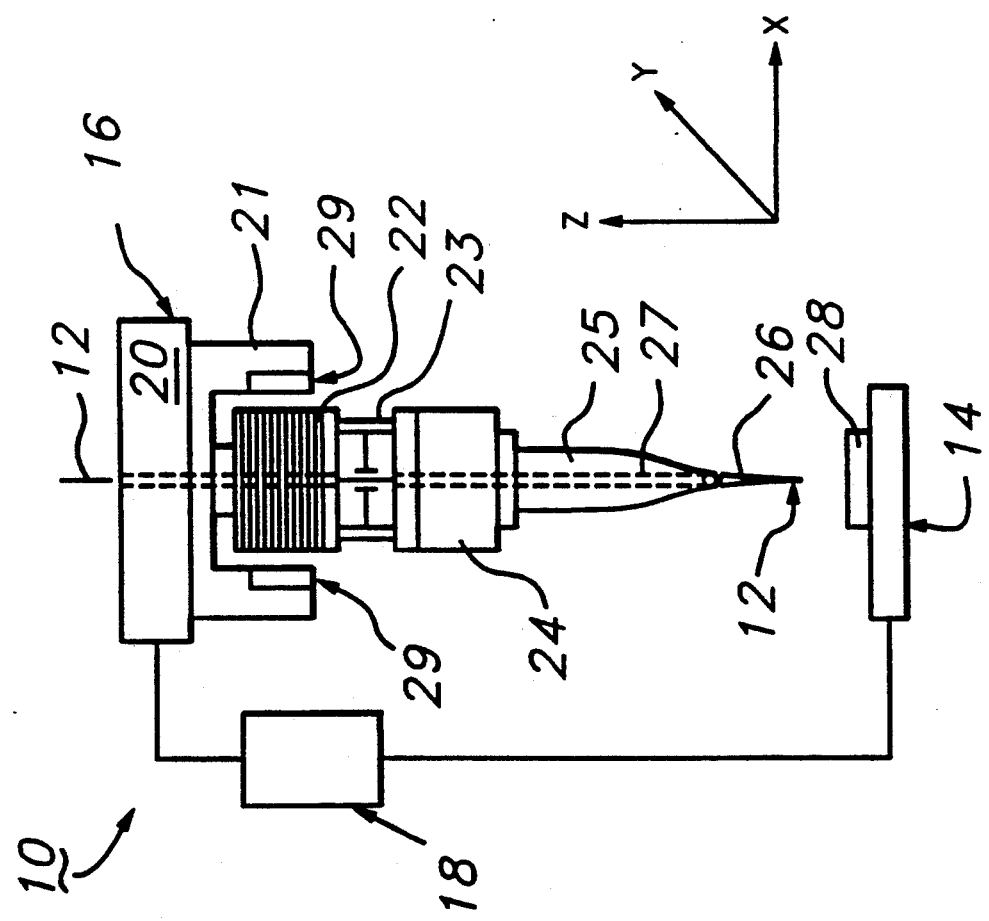
FIG. 2 is partially a front elevational view, partially a block diagram of a bonding apparatus positioned above an integrated circuit in accordance with the present invention.

Referring now to FIG. 2, bonding apparatus 10 is shown with a bonding wire 12 and integrated circuit 14 according to the invention. Wire 12 is disposed partially within a bondhead assembly 16 and the remaining portions of apparatus 10 are symbolically represented by block 18. Bondhead assembly 16 bonds wire 12 to IC 14 with high frequency ultrasonic (H.F. US) energy. Bondhead assembly 16 advantageously utilizes a substantially linear bond stroke in the negative Z direction eliminating the undesirable arcing motion of prior art. Bondhead assembly 16 acts as a lengthwise guide and sheath for certain portions of wire 12, hence guarding against the types of mishaps mentioned above.

Figure 3:
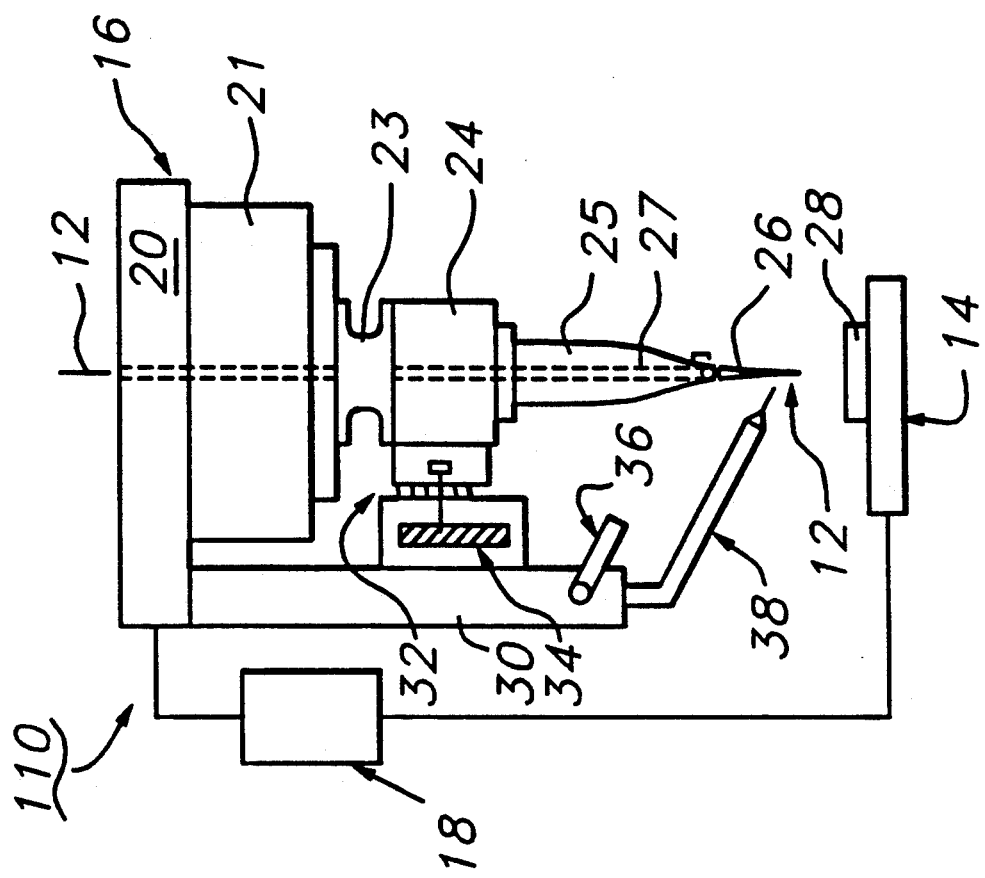
FIG. 3 is partially a side elevational view, partially a block diagram of the bonding apparatus of FIG. 2, with an integrated circuit.

Note the orientational indicia between FIGS. 2 and 3 namely, the positive X, Y and Z axes.

Bondhead assembly 16 includes bondhead mounting plate 20, stationary magnetic circuit 21, moving coil 22, primary wire clamp housing 23, (note that primary wire clamp 23 is shown sectionally in FIG. 2), ultrasonic transducer mount 24, reduced mass, H.F. US transducer 25, and bonding tool or capillary 26.

A collective, axial wire path bore 27 is formed lengthwise through bondhead assembly 16 by virtue of each of the respective elements 20–26 collectively having structure forming respective axial wire path bores. Note that wire 12 is sited within collective axial wire path bore 27 and that the portion of wire 12 on top is shown cut away simply for ease of illustration. It will be readily apparent that wire 12 is actually fed from a spool (a part of the symbolic representation of block 18).

IC 14 includes a bond site 28 suitable for formation of a microelectronic bond. Further, IC 14 presents a lengthwise, substantially horizontal plane (i.e. a plane substantially parallel to the plane defined by the X and Y axes).

IC 14 is conventional in nature and could be, for example, a 16 megabit DRAM (dynamic random access memory) such as manufactured by Texas Instruments, Incorporated of Dallas, Tex. IC 14 substantially includes manufacturing grade monocrystalline silicon for the substrate but other materials could also be used. For example, but not by way of limitation, gallium arsenide or germanium could be used for the substrate of IC 14. Other types of memory ICs are within the scope of the present invention, such as static random access memories. Indeed, logic dies or linear semiconductors such as power devices could also be the subject of the present process. Additionally IC 14 need not be a VLSI chip but could also be an MSI or SSI chip, and indeed could be a discrete or hybridized component.

The remainder of apparatus 10, represented by block 18 as mentioned previously, includes but is not limited to an X-Y table (for shifting of assembly 16 in the X-Y plane) and an electronic controller which is a digital signal processor in the preferred embodiment but could alternatively be an analog or other type controller. Note also permanent magnets 29 housed in magnetic circuit 21. Other structure less germane to the invention is also symbolized by 18 but is omitted for brevity of the discussion and because that kind of structure is readily apparent to those skilled in the art.

Referring to FIG. 3, bonding apparatus 10 is shown from a side view. As shown in FIG. 3 assembly 16 further includes side plate 30, linear guide 32, position/velocity transducer 34, work piece illuminator 36, and electric flame off (EFO) torch 38. It should be noted that EFO torch 38 (which is for creating a ball on the end of wire 12 for bonding purposes) can be either stationary or moveable. For illustration and discussion of ball and stitch bonding in more detail see any other the three related applications mentioned at the beginning of the present application.

Linear guide 32 is a linear air bearing in the preferred embodiment but alternatively could be a linear rolling element bearing. Transducer 34 is a position and velocity transducer in the preferred embodiment but alternatively it could be simply a position transducer or a velocity transducer.

The process for utilizing bonding apparatus 10 will now be discussed. Generally speaking, the rest of bonding apparatus 10 symbolized by block 18 contains the electronic controls and the various subsystems integrated therein. Prior to bonding, the X-Y table is actuated so as to translate bondhead assembly 16 in the X-Y plane until bondhead assembly 16 is precisely located vertically above the appropriate bond site 28. A ball is then formed on the end of wire 12 using an EFO torch (in the case of ball bonding). A bond stroke in the negative Z direction is then performed utilizing the actuation of moving coil 22.

This results in a very precise and responsive bond stroke which is substantially linear in the negative Z direction. A portion of wire 12 is sited in bore 27 and thus protected from mishap. Moving coil 22 is similar to a voice-coil activation type, as can be custom ordered from Texas Instruments Incorporated of Dallas Tex. for specific applications.

Because coil 22 is digitally controlled and designed with a very responsive technology, it exhibits essentially continuous displacement capability, therefore resulting in very precise placement and responsiveness in the Z direction.

Ultrasonic transducer 25 has a reduced length and reduced mass when compared with transducers in the prior art. This is in large part due to the fact that block 18 includes an H.F. US energy source. H.F. US energy exhibits a shorter wavelength and a lower amplitude oscillation compared to the conventional US energy at (e.g. about 60 kHz). Therefore the length of H.F. US transducer 25 is shorter than conventional transducers in order to accommodate the shorter wavelength generated by H.F. US. The shorter length results in reduced mass. Thus with the reduced mass, the amount of force required from moving coil 22 is less, adding to the responsiveness of bondhead assembly 16. Note also that if low frequency (e.g. about 60 kHz) US energy were used, reduced mass ultrasonic transducer 25 would not be feasible due to the large wavelength inherent in the low frequency cycle. For purposes of the following discussion on effective transducer length the reader is referred to FIGS. 6 and 7 of the above incorporated reference, TI-14570 and accompanying text.

As an example for the sake of comparison, a prior art transducer is effectively about 3.15 inches long, and is designed to transmit US energy at about 62.5 kHz so that 1.25 wavelengths are disposed along the effective length of the transducer.

The effective length of transducer 25 is about 2.16 inches. Transducer 18, in the preferred embodiment, is designed to transmit 114 kHz H.F. US energy so that 1.25 wavelengths are disposed along the effective length.

Thus, the effective length of transducer 25 is reduced compared to the effective length of the 62.5 kHz transducer. The specific reduction in length will depend on the H.F. US used and the design of the transducer, and these parameters will vary for different applications.

Since bondhead assembly 16 is substantially linear adjustable in the Z direction and since the approach to bond site 28 is substantially vertical, bonding apparatus 10 exhibits great flexibility over a range of applications for many different types of package sizes and shapes, in accordance with the invention. For example, deep access packages which are troublesome for prior art bonders are much easier to work on in the present invention. In other words, bondhead assembly 16 can simply be elevated in the positive Z direction and then adjusted in the X Y plane till directly over the appropriate bond site and then a substantially linear approach in the negative Z direction is performed and then finally the bonding stroke is performed. Another example is a multilevel package where bonding must be performed at different levels (e.g. the leadframe is at a different level from the die metallization). With the conventional arcing bonding stroke, the bonding tool will address only one bond site level (at best) in a substantially vertical orientation. Thus, bonding apparatus 10 provides great flexibility in the types of package design, size and configuration that can be worked upon. Also the substantial perpendicularity of bonding tool 26 to bonding site 28 results in a more consistent, even weld.

Although the invention has been described in detail herein with reference to its preferred embodiment and certain described alternatives, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. It is contemplated that all such changes and additional embodiments are within the spirit and true scope of the invention as claimed below.

What is claimed is:

1. A method of forming a microelectronic bond, the method comprising the steps of:
   (a) providing an integrated circuit having a conductive bond site, the integrated circuit presenting a substantially horizontal lengthwise plane;
   (b) providing a wire having a bond end, and orienting the wire to extend perpendicular relative to the lengthwise plane of the integrated circuit; and
   (c) contacting the bond end of the wire to the bond site by a substantially linear stroke perpendicular to the lengthwise plane of the integrated circuit, the bond end and the bond site presenting an interface therebetween.

2. The method of claim 1, further comprising:
   (d) applying ultrasonic energy at the interface at a frequency above about 100 kHz.

3. A method of forming a microelectronic bond, the method comprising the steps of:
   (a) providing an integrated circuit having a conductive bond site, the integrated circuit presenting a substantially horizontal lengthwise plane;
   (b) providing a wire having a bond end;
   (c) providing an ultrasonic transducer which is elongated in a lengthwise direction and has a lengthwise bore extending therethrough in the lengthwise direction thereof;
   (d) routing the wire through the lengthwise bore of the ultrasonic transducer; and
   (e) contacting the bond end of the wire to the bond site, the bond end and the bond site presenting an interface therebetween.

4. The method of claim 3 wherein step (e) includes a substantially linear stroke substantially perpendicular to the lengthwise plane of the integrated circuit.

5. A bondhead assembly comprising:
   a bondhead mounting plate;
   a stationary magnetic circuit mounted adjacent the mounting plate;
   a moving coil mounted adjacent the stationary magnetic circuit;
   a primary wire clamp housing mounted adjacent the moving coil;
   a transducer mount mounted adjacent the primary wire clamp; and
   an ultrasonic transducer mounted adjacent the transducer mount, the mounting plate, the magnetic circuit, the moving coil the primary wire clamp, the transducer mount and the ultrasonic transducer each containing structure forming a collective axial wire path bore.

6. The bondhead assembly of claim 5, further comprising:
   a capillary having structure forming an axial wire path bore, the capillary mounted adjacent the transducer, the axial wire path bore of the capillary substantially colinearly extending the collective wire path bore of the bondhead assembly.

7. The bondhead assembly of claim 6 further comprising:
   a wire disposed in the collective wire path bore of the bondhead assembly.

8. In combination, the bondhead assembly of claim 7 and bonding apparatus adapted for positioning the bondhead assembly adjacent an integrated circuit device and bonding the wire to the device.

9. The bondhead assembly of claim 5, further comprising;
   a linear guide mounted adjacent the transducer mount; and
   a position/velocity transducer mounted adjacent the linear guide.

10. A bonding apparatus, comprising:
    a transducer having an axial wire path bore; and
    a capillary fixed to said transducer, said capillary having an axial wire path bore, the axial wire path bore of the capillary and the axial wire path bore of the transducer defining a combined wire path bore having a length which exceeds the respective lengths of the transducer bore and the capillary bore.

11. The bonding apparatus of claim 10 wherein the wire path bore of the transducer and the wire path bore of the capillary are substantially colinear.

12. The bonding apparatus of claim 11, wherein said transducer bore adjoins and communicates with the capillary bore.

* * * * *